(12) United States Patent
Yosui

(10) Patent No.: US 10,709,014 B2
(45) Date of Patent: Jul. 7, 2020

(54) MULTILAYER SUBSTRATE

(71) Applicant: Murata Manufacturing Co., Ltd., Nagaokakyo-shi, Kyoto-fu (JP)

(72) Inventor: Kuniaki Yosui, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/297,765

(22) Filed: Mar. 11, 2019

(65) Prior Publication Data

US 2019/0208623 A1 Jul. 4, 2019

Related U.S. Application Data

(63) Continuation of application No. PCT/JP2018/027417, filed on Jul. 23, 2018.

(30) Foreign Application Priority Data

Aug. 1, 2017 (JP) .................. 2017-148822

(51) Int. Cl.
*H03H 7/38* (2006.01)
*H05K 1/02* (2006.01)
(Continued)

(52) U.S. Cl.
CPC ........... *H05K 1/0245* (2013.01); *H01P 3/026* (2013.01); *H01P 5/028* (2013.01); *H03H 7/38* (2013.01);
(Continued)

(58) Field of Classification Search
CPC . H03H 7/38; H01P 5/028; H01P 5/022; H01P 5/00; H01P 3/026; H05K 1/0251;
(Continued)

(56) References Cited

U.S. PATENT DOCUMENTS 7,830,221 B2 * 11/2010 Merritt .................... H01P 3/081
174/261
8,633,399 B2 * 1/2014 Kagaya .................... H01P 1/02
174/250
(Continued)

FOREIGN PATENT DOCUMENTS

JP 2001-7530 A 1/2001
JP 2005-277028 A 10/2005
(Continued)

OTHER PUBLICATIONS

Official Communication issued in International Patent Application No. PCT/JP2018/027417, dated Sep. 18, 2018.

*Primary Examiner* — Stephen E. Jones
(74) *Attorney, Agent, or Firm* — Keating & Bennett, LLP

(57) ABSTRACT

A multilayer substrate includes a differential line including first and second line conductors provided on or in a laminated body including base material layers. The differential line includes line portions and a connecting portion that connects the line portions. The connecting portion includes first parallel conductors extending in parallel or substantially in parallel with each other, first interlayer connecting conductors that connect the first parallel conductors in parallel, and connect the first line conductor to the first parallel conductors, second parallel conductors extending in parallel or substantially in parallel with each other, and second interlayer connecting conductors that connect the second parallel conductors in parallel, and connect the second line conductor to the second parallel conductors. The first parallel conductors cross the second parallel conductors as viewed in a laminating direction of the base material layers.

11 Claims, 9 Drawing Sheets

(51) Int. Cl.
*H01P 3/02* (2006.01)
*H01P 5/02* (2006.01)
*H05K 3/46* (2006.01)

(52) U.S. Cl.
CPC ............ *H05K 1/02* (2013.01); *H05K 1/0251* (2013.01); *H05K 3/46* (2013.01); *H05K 2201/09236* (2013.01)

(58) Field of Classification Search
CPC .... H05K 1/025; H05K 1/0237; H05K 1/0245; H05K 2201/09236; H05K 2201/09245
USPC .......................... 333/33, 254, 260, 238, 246
See application file for complete search history.

(56) References Cited

U.S. PATENT DOCUMENTS

2006/0158280 A1* 7/2006 Jow ...................... H05K 1/0251 333/33
2013/0107488 A1  5/2013 Arai

FOREIGN PATENT DOCUMENTS

| JP | 2007-287750 A | 11/2007 |
| JP | 2010-93018 A | 4/2010 |
| JP | 2013-97845 A | 5/2013 |

\* cited by examiner

X1-X1 CROSS SECTION

X2-X2 CROSS SECTION

MULTILAYER SUBSTRATE

CROSS REFERENCE TO RELATED APPLICATIONS

This application claims the benefit of priority to Japanese Patent Application No. 2017-148822 filed on Aug. 1, 2017 and is a Continuation Application of PCT Application No. PCT/JP2018/027417 filed on Jul. 23, 2018. The entire contents of each application are hereby incorporated herein by reference.

BACKGROUND OF THE INVENTION

1. Field of the Invention

The present invention relates to a multilayer substrate, and in particular, to a multilayer substrate including a transmission line.

2. Description of the Related Art

A differential line is often used when the frequency band of a signal to be transmitted is high or when high speed data transmission is required. When such a differential line is formed in a multilayer substrate, line conductors formed in different layers are connected through vias.

A multilayer substrate including a differential line for high-frequency signal transmission is disclosed in JP 2005-277028 A, for example. In the multilayer substrate disclosed in JP 2005-277028 A, two signal lines (line conductors) respectively formed in two dielectric layers are interlayer-connected through vias, respectively.

The characteristic impedance of the differential line is set to be equal to the input/output impedance of the circuit connected to the differential line. In general, it is set to be an impedance according to a predetermined standard.

In order to reduce the occupation area of the differential line in the multilayer substrate as much as possible so as to reduce the size of the device, the line width and the line spacing of the differential line are designed to be narrow within a range that a conductor loss does not exceed an allowable value.

With respect to the line conductors extending in the plane direction of the multilayer substrate, it is relatively easy to design the line width and the line spacing to be narrow. However, for the connecting portion (via forming portion) connecting the line portions, it is difficult to reduce the via diameter and the distance between the vias due to the manufacturing process.

Therefore, the interval between vias adjacent to each other tends to be relatively wide, so that unnecessary radiation is generated from adjacent vias, and the unnecessary radiation may adversely introduce noise to other circuits adjacent to the vias. Further, it is possible to achieve a predetermined characteristic impedance by decreasing both the line width and the line spacing of the line conductors extending in the plane direction of the multilayer substrate. However, in the case in which the via portion does not have a predetermined impedance due to the limitation described above, signal reflection occurs in the via portion. That is, distortion of a signal waveform and an insertion loss become problems.

SUMMARY OF THE INVENTION

Preferred embodiments of the present invention provide multilayer substrates in each of which the problems of unnecessary radiation and impedance mismatching in a connecting portion connecting line portions are overcome.

A multilayer substrate according to a preferred embodiment of the present invention includes a laminated body including a plurality of base material layers laminated to each other, and a differential line provided on or in the laminated body and including a first line conductor and a second line conductor.

The differential line includes a plurality of line portions provided in different layers and extending in a plane direction of the plurality of base material layers, and a connecting portion that connects the plurality of line portions to each other.

The connecting portion includes first parallel conductors including a plurality of first conductors extending in parallel or substantially in parallel with each other, a plurality of first interlayer connecting conductors that connect the first parallel conductors in parallel and connect the first line conductor to the first parallel conductors, second parallel conductors including a plurality of second conductors extending in parallel or substantially in parallel with each other, and a plurality of second interlayer connecting conductors that connect the second parallel conductors in parallel and connect the second line conductor to the second parallel conductors.

The first parallel conductors cross the second parallel conductors, as viewed in a laminating direction of the plurality of base material layers.

With the structure described above, a capacitance component is generated between the first parallel conductors and the second parallel conductors. In addition, the capacitance component generated between the first interlayer connecting conductors and the second interlayer connecting conductors increases, as compared with a structure merely including two vias. With this structure, unnecessary radiation and impedance mismatching at the connecting portion are reduced or prevented.

It is preferable that the plurality of first interlayer connecting conductors and the plurality of second interlayer connecting conductors are line symmetrical with respect to an axis in an extending direction of the first line conductor and the second line conductor, as viewed in the laminating direction of the plurality of base material layers. With this structure, the symmetry between the first parallel conductors and the second parallel conductors, and the symmetry between the first interlayer connecting conductors and the second interlayer connecting conductors are ensured, and the balance of the differential line is easily maintained.

It is preferable that the first parallel conductors and the second parallel conductors are disposed such that a first layer including a first parallel conductor, a second layer including a second parallel conductor, a third layer including a first parallel conductor, and a fourth layer including a second parallel conductor are provided sequentially in the laminating direction, and the interlayer distance between the first layer and the second layer or the interlayer distance between the third layer and the fourth layer is shorter than the interlayer distance between the second layer and the third layer.

With the structure described above, since at least two pairs of one first parallel conductor and one second parallel conductor that cross each other with a narrow interlayer distance are provided, it is possible to effectively increase the capacitance component between the first parallel conductors and the second parallel conductors.

It is preferable that the first interlayer connecting conductors and the second interlayer connecting conductors each include a horizontal cross section having a shape in which the first interlayer connecting conductors face the second interlayer connecting conductors with linear sides. With this structure, the capacitance generated between the first interlayer connecting conductor and the second interlayer connecting conductor is effectively increased.

For example, the cross-section of each of the first interlayer connecting conductors and the second interlayer connecting conductors has a quadrangular or substantially quadrangular shape. This makes it possible to effectively increase the capacitance component between the first interlayer connecting conductors and the second interlayer connecting conductors without increasing the inductance components of the first interlayer connecting conductors and the second interlayer connecting conductors.

For example, the cross-section of each of the first interlayer connecting conductors and the second interlayer connecting conductors include a cutout provided on an outer periphery except for the sides at which the first interlayer connecting conductors face the second interlayer connecting conductors. This makes it possible to increase the inductance components of the first interlayer connecting conductors and the second interlayer connecting conductors without reducing the capacitance component between the first interlayer connecting conductors and the second interlayer connecting conductors.

According to preferred embodiments of the present invention, unnecessary radiation in the connecting portion connecting the line portions is reduced or prevented. In addition, multilayer substrates in which impedance mismatching in the connecting portion is reduced or prevented is obtained.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
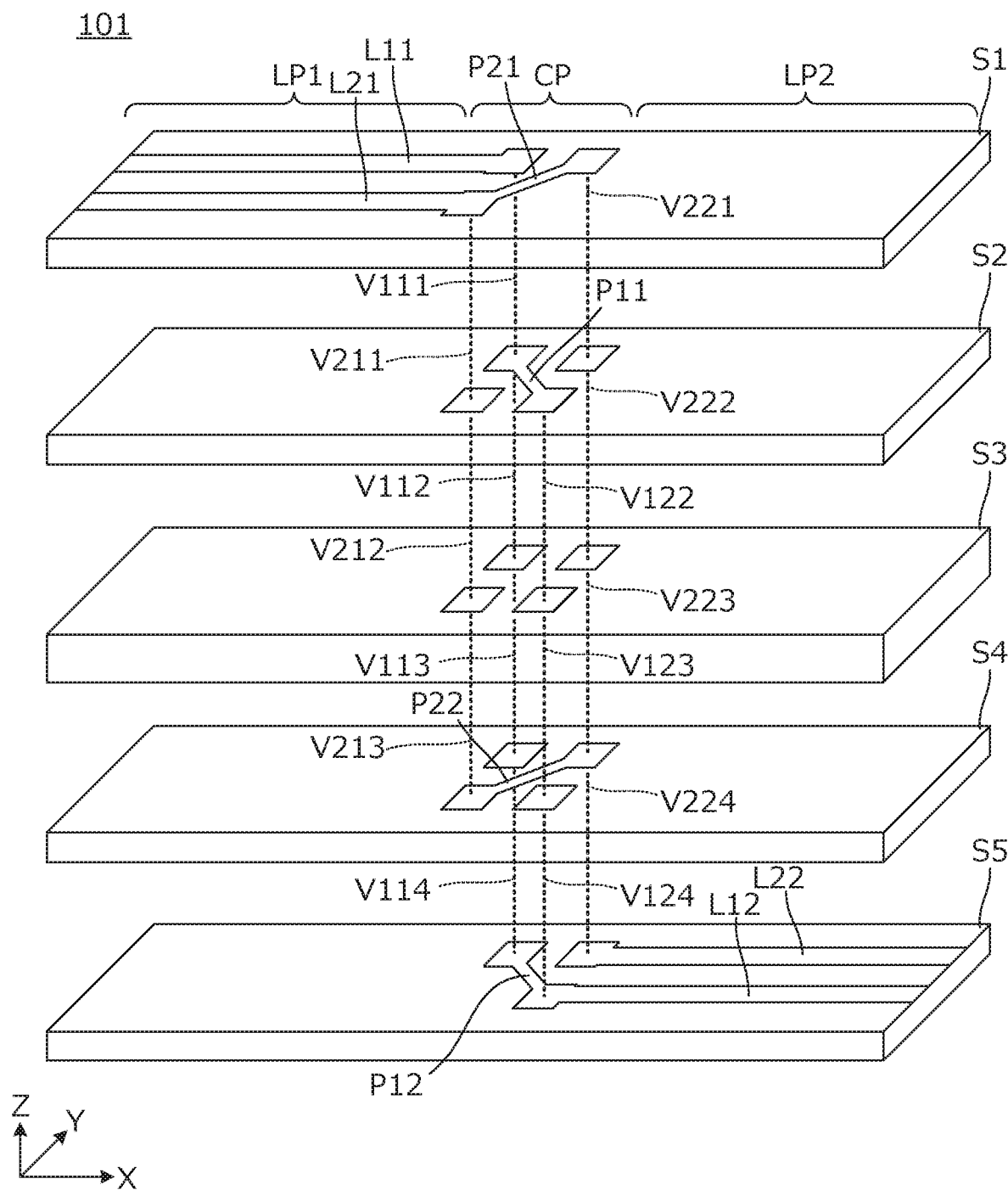
FIG. 1 is an exploded perspective view of a multilayer substrate 101 according to a first preferred embodiment of the present invention.

Hereinafter, preferred embodiments of the present invention will be described using several specific examples with reference to the drawings. The same or substantially the same portions are denoted by the same reference numerals in each of the drawings. To facilitate explanation and/or understanding of the main points, preferred embodiments are separately shown. However, partial substitutions or combinations of configurations shown in different preferred embodiments are possible. In the second and subsequent preferred embodiments, description of matters common to those of the first preferred embodiment are omitted, and only different points will be described. Particularly, the same advantageous operations and effects by the same or substantially the same configuration will not be described in every preferred embodiment.

First Preferred Embodiment

Figure 2:
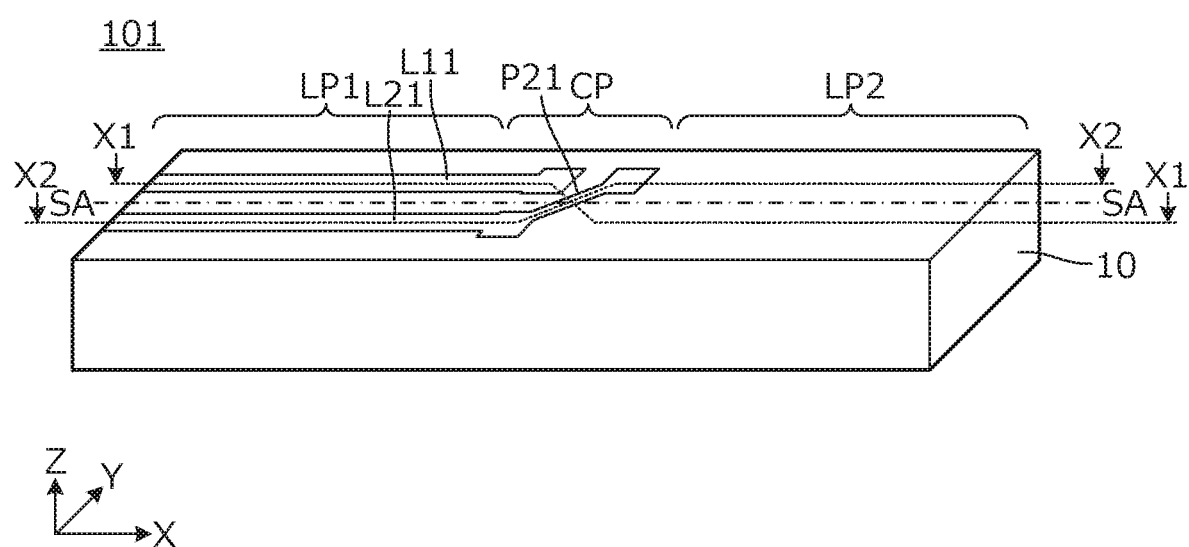
FIG. 2 is a perspective view of the multilayer substrate 101.

FIG. 1 is an exploded perspective view of a multilayer substrate 101 according to a first preferred embodiment of the present invention. FIG. 2 is a perspective view of the multilayer substrate 101.

The multilayer substrate 101 includes a laminated body in which base material layers S1, S2, S3, S4, and S5 are laminated. A differential line is provided on or in the laminated body 10. The differential line includes line portions LP1 and LP2 extending in the plane direction of the base material layers S1, S2, S3, S4 and S5 and provided in different layers, and a connecting portion CP connecting the line portions LP1 and LP2 to each other.

The first line portion LP1 includes a pair of a first line conductor L11 and a second line conductor L21, and the second line portion LP2 includes a pair of a first line conductor L12 and a second line conductor L22.

The connecting portion CP includes first parallel conductors P11 and P12 extending in parallel or substantially in parallel with each other, and a plurality of first interlayer connecting conductors V111, V112, V113, V114, V122, V123, and V124 connecting the first parallel conductors P11 and P12 in parallel, and connecting the first line conductors L11 and L12 to the first parallel conductors P11 and P12. The connecting portion CP also includes second parallel conductors P21 and P22 extending in parallel or substantially in parallel with each other, and a plurality of second interlayer connecting conductors V211, V212, V213, V221, V222, V223, and V224 connecting the second parallel conductors P21 and P22 in parallel, and connecting the second line conductors L21 and L22 to the second parallel conductors P21 and P22.

As viewed in the laminating direction of the base material layers S1 to S5, the first parallel conductors P11 and P12 and the second parallel conductors P21 and P22 cross each other.

Figure 3A:
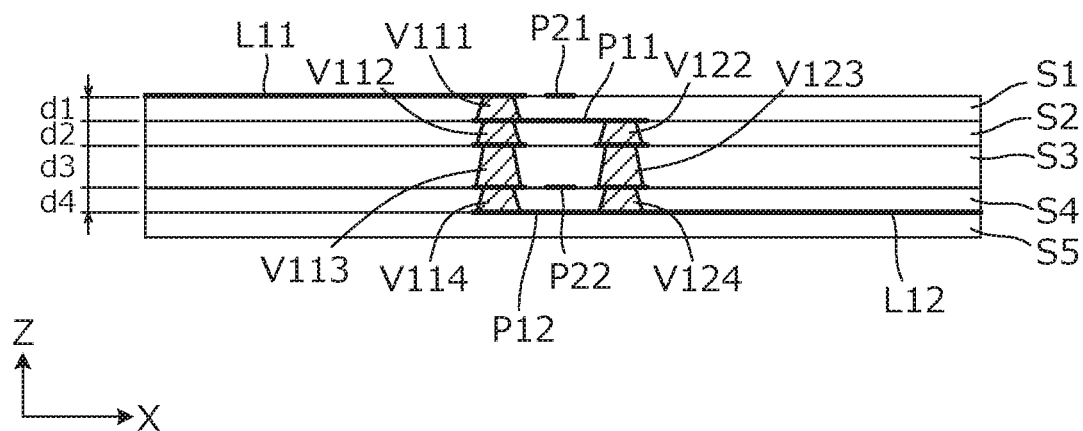
FIG. 3A is a vertical cross-sectional view taken along a line X1-X1 in FIG. 2.

FIG. 3A is a vertical cross-sectional view taken along a line X1-X1 in FIG. 2. In FIG. 3A, one line of the differential line includes the first line conductors L11 and L12, the first parallel conductors P11 and P12, and the first interlayer connecting conductors V111, V112, V113, V114, V122, V123, and V124.

Figure 3B:
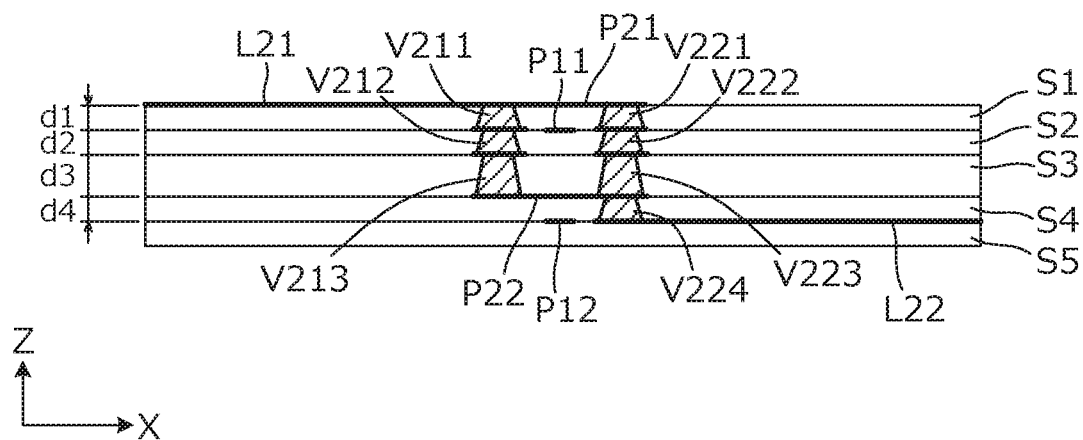
FIG. 3B is a vertical cross-sectional view taken along a line X2-X2 in FIG. 2.

FIG. 3B is a vertical cross-sectional view taken along a line X2-X2 in FIG. 2. In FIG. 3B, the other line of the differential line includes the second line conductors L21 and L22, the second parallel conductors P21 and P22, and the second interlayer connecting conductors V211, V212, V213, V221, V222, V223, and V224.

With the structure described above, a capacitance component is generated between the first parallel conductors P11 and P12, and the second parallel conductors P21 and P22. In addition, since the total opposed area of the first interlayer connecting conductors V111, V112, V113, V114, V122, V123, and V124 and the second interlayer connecting conductors V211, V212, V213, V221, V222, V223, and V224 is relatively large, relatively large capacitances are generated therebetween. With these structures, unnecessary radiation and impedance mismatching in the connecting portion CP are reduced or prevented.

In particular, in the present preferred embodiment, a relationship of (d1+d4)<(d2+d3) is established, where d1, d2, d3, and d4 represent the thicknesses of the base material layers S1, S2, S3, and S4, respectively. In other words, the space between the parallel conductors P11 and P21 and the space between the parallel conductors P12 and P22 are narrower than the space between the parallel conductors P11 and P22. Therefore, a relatively large capacitance is generated between the first parallel conductor P11 and the second parallel conductor P21, where an interlayer distance therebetween is short. Similarly, a relatively large capacitance is generated between the first parallel conductor P12 and the second parallel conductor P22, where an interlayer distance therebetween is short.

Figure 4:
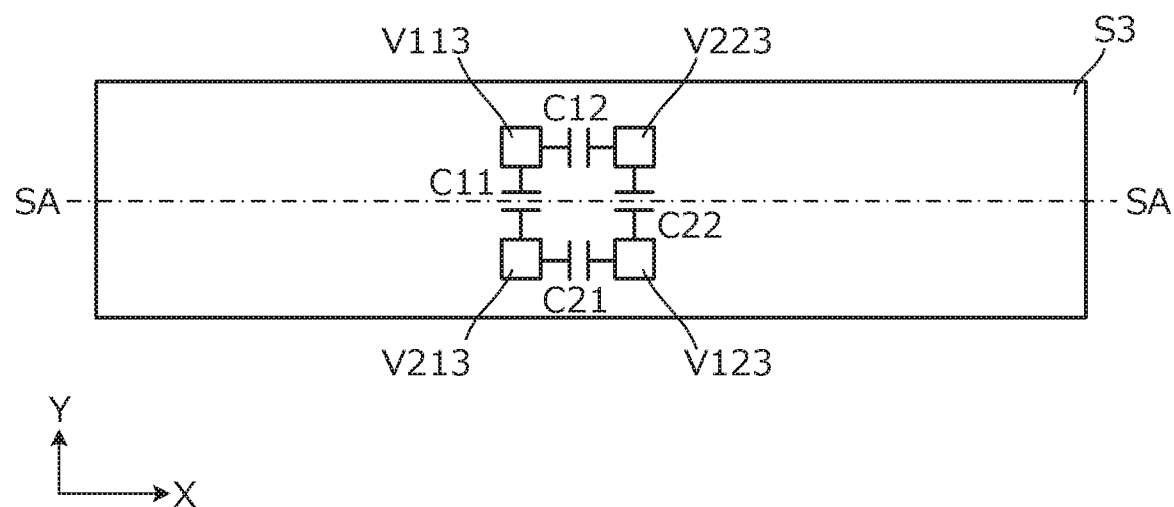
FIG. 4 is a horizontal cross-sectional view taken through a layer of a base material layer S3 in FIG. 1.

FIG. 4 is a horizontal cross-sectional view taken through the layer of the base material layer S3 in FIG. 1. In FIG. 4, the first interlayer connecting conductors V113 and V123 and the second interlayer connecting conductors V213 and V223 are shown. In FIG. 4, capacitance C11 indicates the capacitance generated between the first interlayer connecting conductors V111, V112, V113, and V114, and the second interlayer connecting conductors V211, V212, and V213. The capacitance C12 indicates the capacitance generated between the first interlayer connecting conductors V111, V112, V113, and V114, and the second interlayer connecting conductors V221, V222, V223, and V224. The capacitance C21 indicates the capacitance generated between the first interlayer connecting conductors V122, V123, and V124, and the second interlayer connecting conductors V211, V212, and V213. The capacitance C22 indicates the capacitance generated between the first interlayer connecting conductors V122, V123, and V124, and the second interlayer connecting conductors V221, V222, V223, and V224.

An SA-SA line in FIGS. 4 and 2 indicates an extending direction of the first line portion LP1 and the second line portion LP2. The first interlayer connecting conductors V111, V112, V113, V114, V122, V123, and V124 and the second interlayer connecting conductors V211, V212, V213, V221, V222, V223, and V224 are preferably line symmetrical with respect to the axis in the extending direction (X-axis direction) of the first line portion LP1 and the second line portion LP2, as viewed in the laminating direction of the base material layers.

With this structure, the symmetry of the first parallel conductors P11 and P12, and the second parallel conductors P21 and P22, and the symmetry of the first interlayer connecting conductors V111, V112, V113, V114, V122, V123, and V124, and the second interlayer connecting conductors V211, V212, V213, V221, V222, V223, and V224 are ensured, and the balance of the differential line is easily maintained.

Further, in the present preferred embodiment, the first parallel conductors P11 and P12, and the second parallel conductors P21 and P22 are preferably rotationally symmetrical by about 90° around the crossing position thereof, as viewed in the lamination direction of the base material layers. Therefore, the capacitances C11, C12, C21, and C22 (capacitances generated between the first line conductor and the second line conductor in the connecting portion) shown in FIG. 4 are increased or maximized. As a result, unnecessary radiation is effectively reduced or prevented.

In the multilayer substrate of the present preferred embodiment, the first line conductors L11 and L12 and the second line conductors L21 and L22 have a structure in which the positions thereof are reversed with respect to each other in the connecting portion CP, that is, a structure in which the differential line twists. Accordingly, the differential line is less susceptible to noise from the outside. Further, unnecessary radiation to the outside is reduced or prevented.

In the example shown in FIG. 4, the horizontal cross section of each of the interlayer connecting conductors has a square or substantially square shape, but the horizontal cross section may have a rectangular or substantially rectangular shape. It may also have circular or substantially circular shape, for example. However, in order to increase the capacitance component generated between the first interlayer connecting conductors and the second interlayer connecting conductors, it is preferable that the horizontal cross section of the interlayer connecting conductor has a quadrangular or substantially quadrangular shape, as shown in detail in the preferred embodiments described below.

Second Preferred Embodiment

A second preferred embodiment of the present invention describes a multilayer substrate in which the number of layers of the base material layers in the connecting portion CP is larger than that in the first preferred embodiment.

Figure 5:
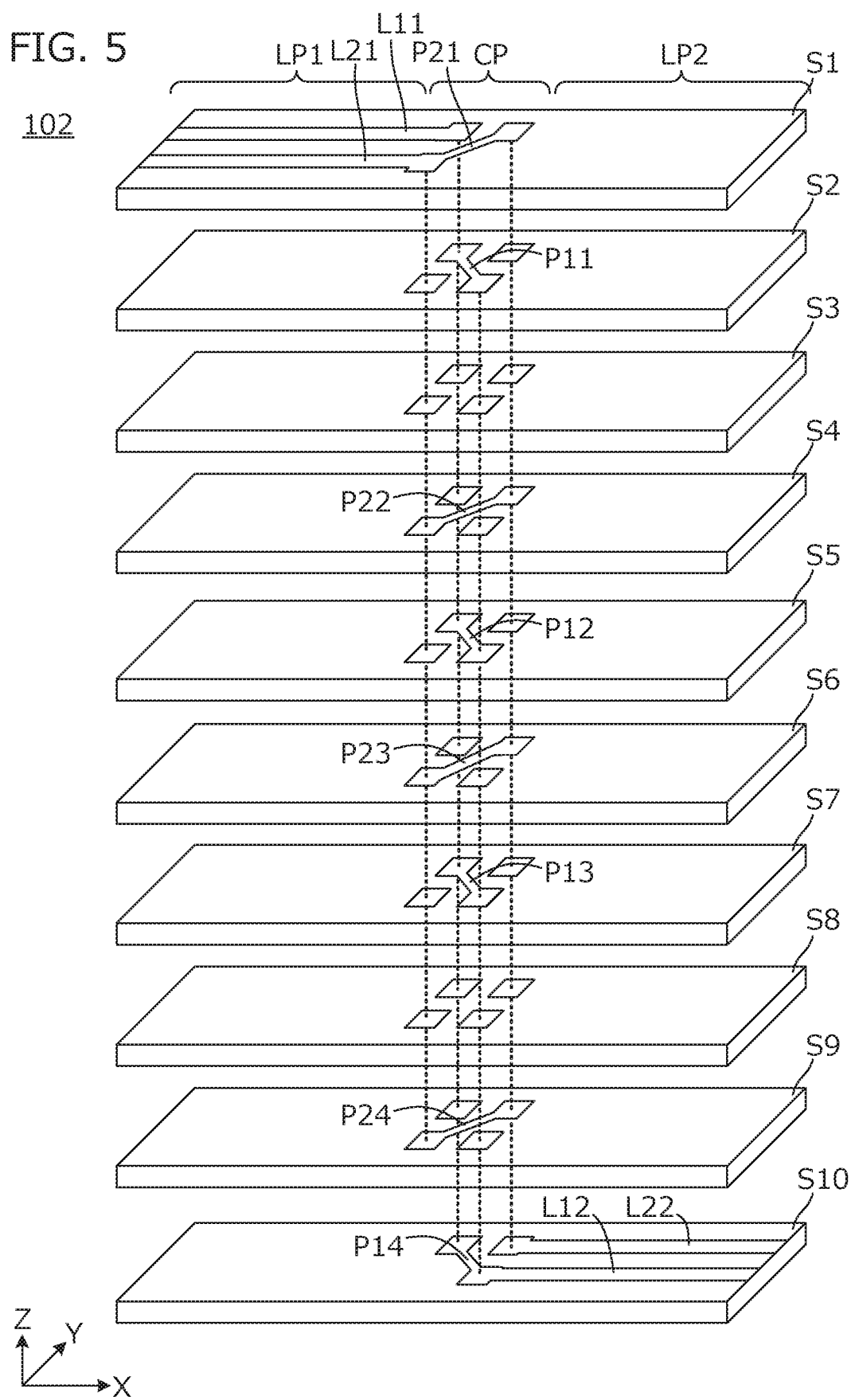
FIG. 5 is an exploded perspective view of a multilayer substrate 102 according to a second preferred embodiment of the present invention.

FIG. 5 is an exploded perspective view of a multilayer substrate 102 according to the second preferred embodiment. The multilayer substrate 102 includes a laminated body in which base material layers S1 to S10 are laminated. A differential line is provided on or in the laminated body. The differential line includes line portions LP1 and LP2 extending in the plane direction of the base material layers S1 to S10 and provided in different layers, and a connecting portion CP connecting the line portions LP1 and LP2 to each other.

The first line portion LP1 includes a pair of a first line conductor L11 and a second line conductor L21, and the second line portion LP2 includes a pair of a first line conductor L12 and a second line conductor L22.

The connecting portion CP includes first parallel conductors P11, P12, P13, and P14 extending in parallel or substantially in parallel with each other, and a plurality of first interlayer connecting conductors that connect the first parallel conductors P11, P12, P13, and P14 in parallel and connect the first line conductors L11 and L12 to the first parallel conductors P11, P12, P13, and P14. The connecting portion CP also includes second parallel conductors P21, P22, P23, and P24 extending in parallel or substantially in parallel with each other, and a plurality of second interlayer connecting conductors that connect the second parallel conductors P21, P22, P23, and P24 in parallel and connect the second line conductors L21 and L22 to the second parallel conductors P21, P22, P23, and P24.

The conductor patterns provided on the base material layers S1 to S4 are the same or substantially the same as those shown in FIG. 1. The conductor patterns provided on the base material layers S2 to S4 are the same or substantially the same as those provided on the base material layers S7 to S9. In this manner, a large number of crossing points of the parallel conductors are provided in the laminating direction so that the number of crossing points is increased.

In this manner, one line of the differential line includes the first line conductors L11 and L12, the first parallel conductors P11, P12, P13, and P14, and the first interlayer connecting conductors. The other line of the differential line includes the second line conductors L21 and L22, the second parallel conductors P21, P22, P23, and P24, and the second interlayer connecting conductors.

According to the present preferred embodiment, the capacitance components generated between the first parallel conductors P11, P12, P13, and P14, and the second parallel conductors P21, P22, P23, and P24 are able to be increased. Also, the capacitance components generated between the first interlayer connecting conductors and the second interlayer connecting conductors are able to be increased.

It is also possible to have a structure in which the positions of the first line conductors L11 and L12, and the second line conductors L21 and L22 are interchanged in the connecting portion CP is repeated a plurality of times in the laminating direction, such that the differential line twists a plurality of times in the laminating direction.

Third Preferred Embodiment

A third preferred embodiment of the present invention describes a multilayer substrate in which the number of crossing points of parallel conductors is increased without increasing the number of layers of the base material layers in a connecting portion CP.

Figure 6:
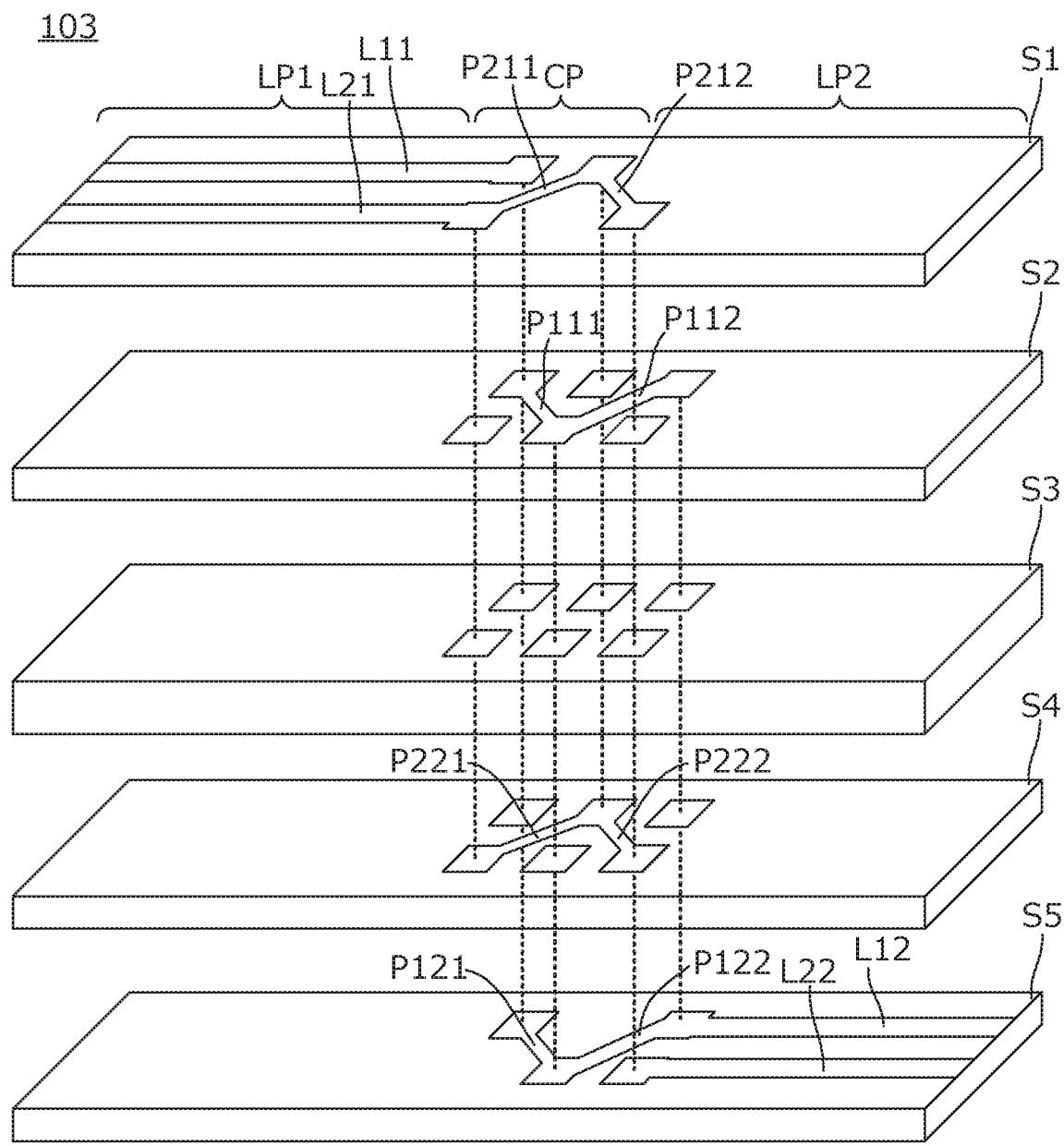
FIG. 6 is an exploded perspective view of a multilayer substrate 103 according to a third preferred embodiment of the present invention.

FIG. 6 is an exploded perspective view of a multilayer substrate 103 according to the third preferred embodiment. The multilayer substrate 103 includes a laminated body in which base material layers S1 to S5 are laminated. A differential line is provided on or in the laminated body. The differential line includes line portions LP1 and LP2 extending in the plane direction of the base material layers S1 to S5 and provided in different layers, and a connecting portion CP connecting the line portions LP1 and LP2 to each other. The configuration of the connecting portion CP of the multilayer substrate 103 is different from that of the multilayer substrate 101 shown in FIG. 1.

The connecting portion CP of the present preferred embodiment includes first parallel conductors P111, P112, P121, and P122, and a plurality of first interlayer connecting conductors that connect the first parallel conductors P111, P112, P121, and P122 in parallel, and connect the first line conductors L11 and L12 to the first parallel conductors P111, P112, P121, and P122. Further, the connecting portion CP includes second parallel conductors P211, P212, P221, and P222, and a plurality of second interlayer connecting conductors that connect the second parallel conductors P211, P212, P221, and P222 in parallel, and connect the second line conductors L21 and L22 to the second parallel conductors P211, P212, P221, and P222.

First parallel conductors P111 and P112 are provided on the base material layer S2 and second parallel conductors P211 and P212 are provided on the base material layer S1, and they cross each other as viewed in the laminating direction of the base material layers. In addition, the first parallel conductors P121 and P122 are provided on the base material layer S5, and the second parallel conductors P221 and P222 are provided on the base material layer S4, and they cross each other as viewed in the laminating direction of the base material layer.

Thus, by providing a plurality of parallel conductors in one layer, it is possible to increase the number of crossing points of the parallel conductors without increasing the number of layers of the base material layers in the connecting portion CP.

According to the present preferred embodiment, the capacitance components generated between the first parallel conductors P111, P112, P121, and P122, and the second parallel conductors P211, P212, P221, and P222 are able to be increased. Also, the capacitance components generated between the first interlayer connecting conductors and the second interlayer connecting conductors are able to be increased.

Fourth Preferred Embodiment

A fourth preferred embodiment of the present invention discloses examples in which a horizontal cross-sectional shape of an interlayer connecting conductor is different from that shown in the first preferred embodiment.

Figure 7:
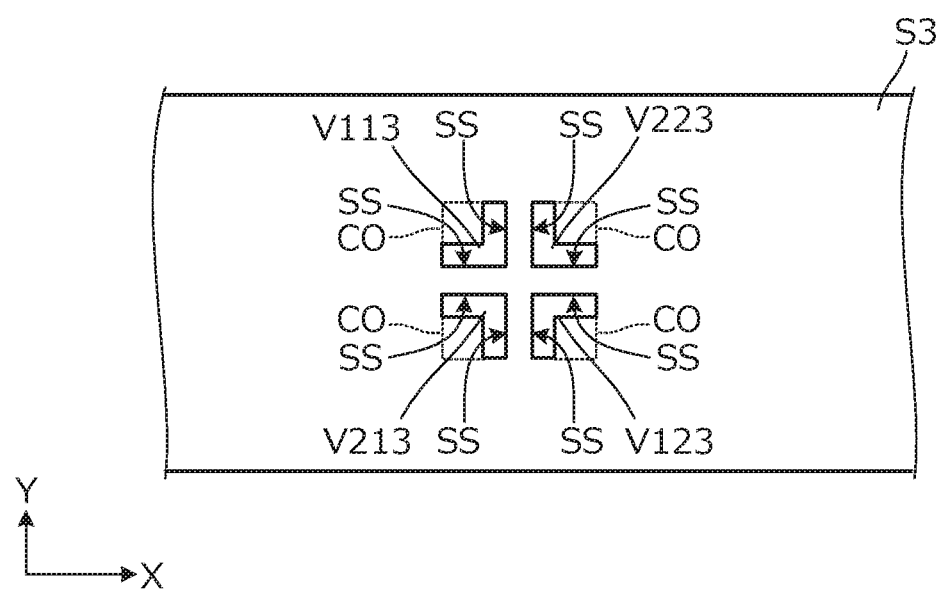
FIG. 7 is a horizontal cross-sectional view of a multilayer substrate according to a fourth preferred embodiment of the present invention.
Figure 8:
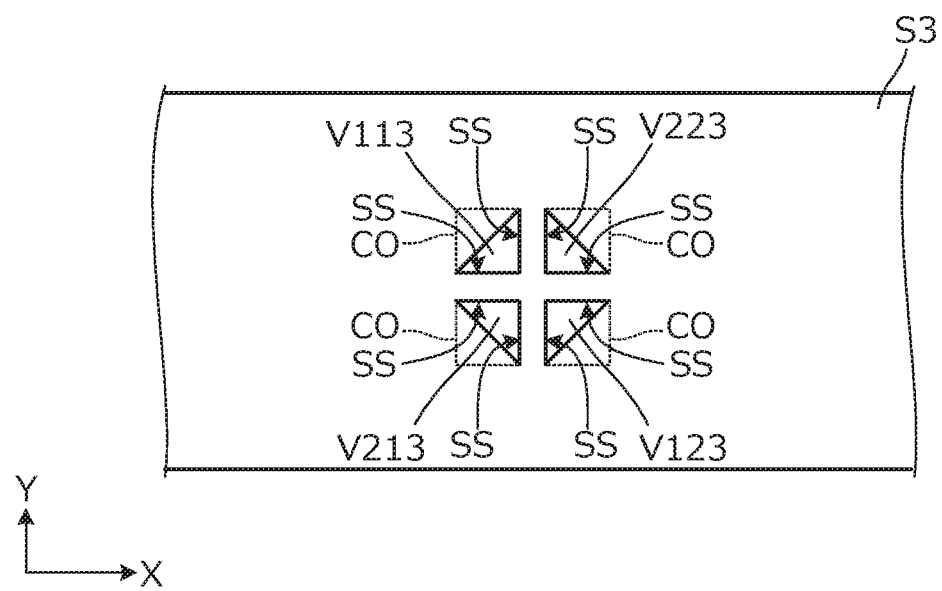
FIG. 8 is a horizontal cross-sectional view of another multilayer substrate according to the fourth preferred embodiment of the present invention.
Figure 9:
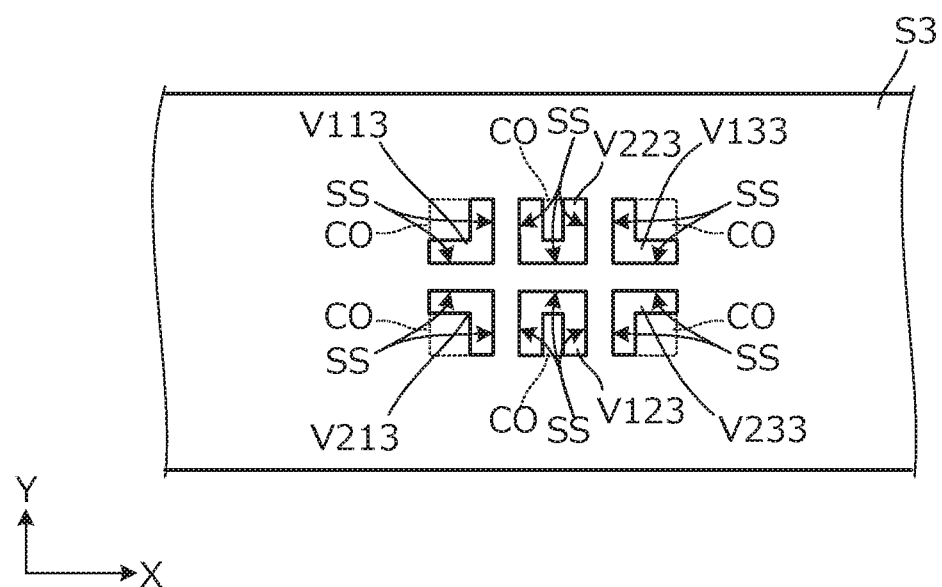
FIG. 9 is a horizontal cross-sectional view of another multilayer substrate according to the fourth preferred embodiment of the present invention.

FIGS. 7, 8, and 9 are horizontal cross-sectional views of examples of different multilayer substrates according to the fourth preferred embodiment.

An exploded perspective view of the multilayer substrate of the fourth preferred embodiment is the same or substantially the same as that shown in FIG. 1. Both of FIGS. 7 and 8 are horizontal cross-sectional views taken through the layer of the base material layer S3 in FIG. 1. FIG. 9 is a cross-sectional view taken through the layer of the base material layer S3 in FIG. 6.

In the example shown in FIG. 7, each of the first interlayer connecting conductors V113 and V123 and the second interlayer connecting conductors V213 and V223 preferably has an L-shaped or a substantially L-shaped horizontal cross section. In the example shown in FIG. 8, each of the first interlayer connecting conductors V113 and V123 and the second interlayer connecting conductors V213 and V223, preferably has a horizontal cross-section in a right-angled triangular or a substantially right-angled triangular shape.

In either of the examples shown in FIGS. 7 and 8, the first interlayer connecting conductor V113, and the second interlayer connecting conductors V213 and V223 face each other along linear sides SS. Similarly, the first interlayer connecting conductor V123, and the second interlayer connecting conductors V213 and V223 face each other along linear sides SS.

While FIGS. 7 and 8 show horizontal cross sections taken through the base material layer S3, the horizontal cross-sectional shapes of the first interlayer connecting conductor and the second interlayer connecting conductor are also the same or substantially the same in the other layers.

With such a structure, it is possible to effectively increase the capacitances generated between the first interlayer connecting conductors and the second interlayer connecting conductors.

Moreover, in either of the multilayer substrates shown in FIGS. 7 and 8, the cross section of each of the first interlayer connecting conductors V113 and V123 and the second interlayer connecting conductors V213 and V223 includes a cutout CO provided on the outer periphery except for the sides along which the first interlayer connecting conductors V113 and V123, and the second interlayer connecting conductors V213 and V223 face each other. While FIGS. 7 and 8 show horizontal cross sections taken through the base material layer S3, the horizontal cross-sectional shapes of the first interlayer connecting conductor and the second interlayer connecting conductor are also the same or substantially the same in the other layers. In this manner, as the outer periphery of the horizontal cross section of the interlayer connecting conductor has a non-circular shape (the outer periphery is longer than that of a circular shape), the inductance components of the first interlayer connecting conductors and the second interlayer connecting conductors are able to be increased, without reducing the capacitance components between the first interlayer connecting conductors and the second interlayer connecting conductors.

In the example shown in FIG. 9, each of the first interlayer connecting conductors V113 and V133 and the second interlayer connecting conductors V213 and V233 preferably has an L-shaped or a substantially L-shaped horizontal cross section. In addition, each of the first interlayer connecting conductor V123 and the second interlayer connecting conductor V223 preferably has a U-shaped or a substantially U-shaped horizontal cross section. The first interlayer connecting conductor V113, and the second interlayer connecting conductors V213 and V223 face each other along the linear sides SS. The first interlayer connecting conductor V123, and the second interlayer connecting conductors V213, V223, and V233 face each other along the linear sides SS. Further, the first interlayer connecting conductor V133, and the second interlayer connecting conductors V223 and V233 face each other along the linear sides SS.

With such a structure, it is possible to effectively increase the capacitance generated between the first interlayer connecting conductor and the second interlayer connecting conductor.

Moreover, also in the multilayer substrates shown in FIG. 9, the cross section of each of the first interlayer connecting conductors V113, V123, and V133 and the second interlayer connecting conductors V213, V223, and V233 preferably includes a cutout CO provided in a rear portion of the sides along which the first interlayer connecting conductors V113, V123, and V133, and the second interlayer connecting conductors V213, V223, and V233 face each other. While FIG. 9 shows a horizontal cross section taken through the base material layer S3, the horizontal cross-sectional shapes of the first interlayer connecting conductor and the second interlayer connecting conductor are also the same or substantially the same in the other layers. This makes it possible to increase the inductance components of the first interlayer connecting conductors and the second interlayer connecting conductors without reducing the capacitance components between the first interlayer connecting conductors and the second interlayer connecting conductors.

In the preferred embodiments described above, the formation positions of the first interlayer connecting conductors and the second interlayer connecting conductors define a tetragonal lattice shape when the connecting portion CP is viewed in the laminating direction of the base material layers. However, the formation positions of the first interlayer connecting conductors and the second interlayer connecting conductors may define an oblique lattice shape. Also, the lengths of the first parallel conductors P11 and P12 and the lengths of the second parallel conductors P21 and P22 may be different.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer substrate comprising:
   a laminated body including a plurality of base material layers laminated to each other; and
   a differential line provided on or in the laminated body and including a first line conductor and a second line conductor; wherein
   the differential line includes a plurality of line portions provided in different layers and extending in a plane direction of the plurality of base material layers, and a connecting portion that connects the plurality of line portions to each other;
   the connecting portion includes:
      a plurality of first parallel conductors extending in parallel or substantially in parallel with each other;
      a plurality of first interlayer connecting conductors that connect the plurality of first parallel conductors in parallel, and connect the first line conductor to the plurality of first parallel conductors;
      a plurality of second parallel conductors extending in parallel or substantially in parallel with each other; and
      a plurality of second interlayer connecting conductors that connect the plurality of second parallel conductors in parallel, and connect the second line conductor to the plurality of second parallel conductors; and
   the plurality of first parallel conductors cross the plurality of second parallel conductors, as viewed in a laminating direction of the plurality of base material layers.

2. The multilayer substrate according to claim 1, wherein the plurality of first interlayer connecting conductors and the plurality of second interlayer connecting conductors are line symmetrical with respect to an axis in an extending direction of the first line conductor and the second line conductor, as viewed in the laminating direction of the plurality of base material layers.

3. The multilayer substrate according to claim 1, wherein the plurality of first parallel conductors and the plurality of second parallel conductors are disposed such that a first layer including one of the plurality of first parallel conductors, a second layer including one of the plurality of second parallel conductors, a third layer including another one of the plurality of first parallel conductors, and a fourth layer including another one of the plurality of second parallel conductors are disposed sequentially in the laminating direction; and
   an interlayer distance between the first layer and the second layer or an interlayer distance between the third layer and the fourth layer is shorter than an interlayer distance between the second layer and the third layer.

4. The multilayer substrate according to claim 1, wherein the plurality of first interlayer connecting conductors and the plurality of second interlayer connecting conductors each have a horizontal cross-sectional shape in which the plurality of first interlayer connecting conductors face the plurality of second interlayer connecting conductors along linear sides thereof.

5. The multilayer substrate according to claim 4, wherein each of the plurality of first interlayer connecting conductors and each of the plurality of second interlayer connecting conductors has a quadrangular or substantially quadrangular cross-sectional shape.

6. The multilayer substrate according to claim 4, wherein each of the plurality of first interlayer connecting conductors and each of the plurality of second interlayer connecting conductors has a cross-sectional shape in which a cutout is provided on an outer periphery except for the linear sides at which the plurality of first interlayer connecting conductors face the plurality of second interlayer connecting conductors.

7. The multilayer substrate according to claim 4, wherein each of the plurality of first interlayer connecting conductors and each of the plurality of second interlayer connecting conductors has a square or substantially square cross-sectional shape.

8. The multilayer substrate according to claim 1, wherein the plurality of line portions include a first line portion including a first pair of the first line conductor and the second line conductor, and a second line portion including a second pair of the first line conductor and the second line conductor.

9. The multilayer substrate according to claim 8, wherein positions of the first line conductor and the second line conductor in the first pair are reversed with respect to positions of the first line conductor and the second line conductor in the second pair.

10. The multilayer substrate according to claim 1, wherein the plurality of first parallel conductors and the plurality of second parallel conductors are rotationally symmetrical by about 90° around a position at which the plurality of first parallel conductors cross the plurality of second parallel conductors.

11. The multilayer substrate according to claim 1, wherein at least two of the plurality of first parallel conductors are provided on a first one of the plurality of base material layers, and at least two of the plurality of second parallel conductors are provided on a second one of the plurality of base material layers.

* * * * *